(12) United States Patent
Barbe et al.

(10) Patent No.: US 7,635,615 B2
(45) Date of Patent: Dec. 22, 2009

(54) MANUFACTURING PROCESSING FOR AN ISOLATED TRANSISTOR WITH STRAINED CHANNEL

(75) Inventors: Jean-Charles Barbe, Grenoble (FR); Sylvian Barraud, Le Grand Lemps (FR); Claire Fenouillet-Beranger, Grenoble (FR); Claire Gallon, Grenoble (FR); Aomar Halimaoui, Le Terrosse (FR)

(73) Assignee: Commissariat A l'Energie Atomique, Paris (FR)

( * ) Notice: Subject to any disclaimer, the term of this patent is extended or adjusted under 35 U.S.C. 154(b) by 651 days.

(21) Appl. No.: 11/454,398

(22) Filed: Jun. 16, 2006

(65) Prior Publication Data

US 2007/0001227 A1 Jan. 4, 2007

(30) Foreign Application Priority Data

Jun. 17, 2005 (FR) .................................. 05 51664

(51) Int. Cl.
*H01L 21/00* (2006.01)
(52) U.S. Cl. ........................................ 438/149; 438/409
(58) Field of Classification Search ................. 438/149, 438/409
See application file for complete search history.

(56) References Cited

U.S. PATENT DOCUMENTS

| 4,104,090 A | 8/1978 | Pogge |
| 5,637,515 A | 6/1997 | Takemura |
| 6,287,936 B1 | 9/2001 | Perea et al. |
| 6,717,217 B2 | 4/2004 | Fogel et al. |
| 6,989,570 B2 | 1/2006 | Skotnicki et al. |
| 2003/0080361 A1 | 5/2003 | Murthy et al. |
| 2004/0031979 A1 | 2/2004 | Lochtefeld et al. |
| 2004/0217430 A1 | 11/2004 | Chu |
| 2005/0090066 A1 | 4/2005 | Zhu et al. |

FOREIGN PATENT DOCUMENTS

| EP | 1 178 532 | 2/2002 |
| EP | 1 487 007 | 12/2004 |
| FR | 2 838 237 | 4/2002 |
| WO | WO 2004/073043 | 8/2004 |

OTHER PUBLICATIONS

Rapport De Recherche Preliminaire, Jan. 19, 2006, France.
L. Canham, Properties of Porous Silicon, EMIS Datareviews Series No. 18, pp. 12-22.

*Primary Examiner*—Douglas M Menz
(74) *Attorney, Agent, or Firm*—Nixon Peabody LLP

(57) ABSTRACT

Transistor type semiconducting device comprising:
  a substrate,
  an insulating layer comprising sidewalls formed on each part of the source zone and the drain zone,
  drain, channel and source zones, the channel zone being formed on the insulating layer and being strained by the drain and the source zones, between the side parts,
  a grid, separated from the channel by a grid insulator.

29 Claims, 6 Drawing Sheets

MANUFACTURING PROCESSING FOR AN ISOLATED TRANSISTOR WITH STRAINED CHANNEL

TECHNICAL DOMAIN AND PRIOR ART

The invention relates to the domain of the semiconductor industry and more specifically to the microelectronics industry.

Integrated circuits are normally built on silicon substrates. The surface of these substrates may comprise one or several layers with different natures, one of them possibly being electrically insulating. <<Silicon On Insulator>> (SOI) type substrates are thus frequently used for various purposes in the microelectronics industry including manufacturing of transistors, because they enable a reduction in parasite capacitances and a reduction of in-depth leakage currents, thus improving the electrical characteristics of components.

Stresses and strains are related by a linear equation for a so-called elastic material, therefore these two terms will be used indifferently in the remainder of this description) applied to a semiconducting material induces a modification to the crystalline lattice and therefore to the band structure, which will modify the mobility of carriers: the mobility of electrons is increased by a tension strain and is reduced by a compression strain in the silicon through which they transit, while the mobility of holes will be increased when the semiconductor is compressed and will be reduced when the semiconductor is stretched.

Over the past approximately ten years, the microelectronics industry has been making use of this principle to improve the electrical characteristics of MOS transistor type devices.

As illustrated on FIG. 1, a MOS transistor made on the surface of a substrate 1 includes the following functional elements: a grid 4 a few tens of nanometers wide (and for example a hundred nanometers high) separated from the channel (the so-called <<transport>> zone 2a on FIG. 1) by an electrical insulator called the grid insulator (zone 3 on FIG. 1).

There are so-called <<access>> zones to the transport zone on each side of the channel, also called the source and drain (zones 2B and 2C shown cross-hatched on FIG. 1).

The source, channel and drain are typically formed from a semiconducting material, usually silicon.

The source and the drain are usually defined in silicon by ionic implantation in the silicon: in this case the channel 2a is simply a region of the initial silicon that is doped differently from the source region 2b and the drain region 2c. The nature of the implanted ionic species (electron donor or acceptor) defines the nature of the transistor formed (NMOS or PMOS respectively) and mechanical stress to be applied to the channel to improve its performances.

Therefore, the electrical characteristics of an NMOS or PMOS type transistor will be improved by applying a tension or compression stress respectively in the transport zone.

There may be spacers (references 5a and 5b on FIG. 1) on each side of the grid 4 and above the channel 2a, the source 2b and the drain 2c, and these spacers may be composed of two layers: the first layer in contact with the grid may be composed of amorphous silicon dioxide, while the second layer is often formed from silicon nitride (Si3N4). On FIG. 1, this spacer assembly is shown diagrammatically in a single block (5a and 5b).

Integration of a semiconducting material (for example an SiGe alloy) with a lattice parameter different from the lattice parameter of the material from which the channel 2a (Si) is formed in the so-called source zone 2b and drain zone 2c by hetero-epitaxy, provides a means of straining the channel 2a as indicated in document US 2003/0080361 A1.

The technique described in this document provides a means of improving the electrical characteristics of a PMOS transistor. However, it is assumed that the silicon is exposed under the source, drain and channel so that the SiGe epitaxy can be resumed.

Therefore, this solution makes it impossible to isolate the component because the insulation layers ($SiO_2$) are mainly amorphous and therefore epitaxy cannot be resumed on their surface.

Therefore with such a technique, it is difficult to limit the leakage currents or to eliminate parasite capacitances by a layer that would electrically isolate the component from the silicon substrate on which it is formed.

French patent No. FR-02-04165 proposes one solution to this problem through the formation of an insulating tunnel under the channel and under the junction zones firstly between the source and the channel and secondly between the channel and the drain. This invention also uses a strained channel, but this strained channel is intrinsically strained in tension: this configuration improves the electrical characteristics of an NMOS transistor but deteriorates the characteristics of PMOS components. Furthermore, a continuous insulating layer cannot be formed under the entire device with this proposed solution.

Therefore, the problem arises of finding a process and a device with better performances than those of known structures.

PRESENTATION OF THE INVENTION

The invention relates firstly to a transistor type semiconducting device comprising:
  a substrate,
  an insulating layer comprising sidewalls formed on each part of the source zone and the drain zone,
  drain, channel and source zones, the channel zone being formed on the insulating layer and being strained by the drain and the source zones,
  a grid, separated from the channel by a grid insulator and provided with two spacers.

The insulating layer that isolates the channel from the substrate may be obtained by oxidation of a porous material, itself resulting from a transformation of the same dense material.

The insulating layer may be formed by the oxidation of an Si and Ge alloy previously made porous, the source and the drain zones then possibly being made of silicon.

The insulating layer may be formed by oxidation of an $Si_xGe_{1-x}$ ($0<x<1$) alloy, the source and the drain zones then possibly being made of $Si_yGe_{1-y}$ ($0<y<1$).

The insulating layer may be continuous and may extend over the entire surface of the substrate, its thickness possibly varying from one zone to another in the substrate; the drain and the source zones being formed in cavities which stop at the surface or within the thickness of the insulating layer, and do not open up into the substrate.

The source and drain zones may be obtained by epitaxy. When this epitaxy is used from a porous material, it obstructs the pores opening up on the surface of the said porous layer without filling them.

The insulating layer may be discontinuous, the drain and the source zones being formed in cavities opening up in the substrate.

The insulating layer may be discontinuous, the drain and the source zones being formed in cavities opening up in the insulating layer.

Zones may be kept dense (and therefore not insulating) between the source and/or the drain and the insulating sidewalls, to amplify the strains applied on the channel by the source and the drain.

In order to obtain the required strain, the lattice parameter and/or coefficient of thermal expansion of the material from which the drain and source zones are composed may be different from the lattice parameter and/or the coefficient of thermal expansion of the material from which the layer that will be subsequently oxidized to form the insulating layer is composed if these zones will eventually open up on the surface or within the thickness of the insulating layer, or they may be different from the lattice parameter and/or the coefficient of thermal expansion of the substrate if these zones are formed on the substrate.

Therefore, the channel may be in compression or in tension.

A transistor according to the invention may be an NMOS or a PMOS type transistor.

The grid insulator may be made of $HfO_2$.

The grid may comprise a stack of TiN and a layer made of poly-crystalline silicon.

The spacers may be made of $Si_3N_4$ or may comprise a stack of $SiO_2$ and SiN.

The channel zone may be N+ implanted.

The invention also proposes a transistor manufacturing process that includes manufacturing of a specific substrate.

Such a process can be used to obtain a channel deformation while providing the possibility of having a continuous or non-continuous electrically insulating layer under the entire device.

Therefore, the invention relates to a process for obtaining a transistor type component, for example of the MOS type, with a strained channel and isolated from the substrate and components surrounding it.

A mechanical stress effect is used to modify electron transport characteristics, which can be used to obtain better electrical characteristics than an unstrained device.

Furthermore, the strained component, or at least the channel of the component, is electrically insulated from the substrate on which it is made; this insulation may extend under all or part of the component.

This preparation of a specific technological stack may be done from a silicon substrate (possibly doped).

According to the invention, a doped buried layer or zone is formed delimited from its environment by a slightly N doped silicon zone (concentration less than $10^{17}$ atoms/cm$^3$).

With this initial architecture, it is possible to use an electrochemical step later to make a buried zone of the substrate porous. This electrochemical step is selective only with regard to the N slightly doped zones (concentration less than $10^{17}$ atoms/cm$^3$) therefore, the built up technological stack leads to the formation of slightly doped N zones that delimit P or N+ doped zones: these N zones act as stop zones for the electrochemical transformation.

Therefore, the invention also relates to a process for the formation of a strained channel transistor isolated from the substrate, on a substrate, comprising:

formation of a layer called the first layer on the said substrate, delimitation of a channel zone on the said first layer, in a layer made of a semiconducting material called the second layer, formation of a grid insulator and a grid and spacers on each side of the grid, formation of drain and source zones on each side of the channel, the channel zone being strained by these drain and source zones.

The formation of the porous insulating layer may comprise an oxidation step of a porous layer.

Therefore, it is possible to:

form the first layer (Si or SiGe or other), form the second layer in which the channel will be defined, make the first layer porous, the second layer possibly being protected by an oxide that could also act as a grid oxide, form the grid and the spacers, form so-called source and drain zones.

The first layer can then be made insulating by oxidation.

The first layer may be made porous and then insulating before the second layer in which the channel will be made afterwards is formed.

The first layer may be made porous after the second layer in which the channel is made afterwards is formed.

A prior step may include formation of doped windows or zones, or trenches, in the second layer.

The invention also relates to a process for formation of a strained channel transistor isolated from the substrate, on a substrate comprising:

a step to form a first layer on the said substrate, a step to form a channel zone on the first layer, in a layer made of a semiconducting material, called the second layer, a step to form a grid insulator, a grid and spacers on each side of the grid, then in this order or in the reverse order:

a step to form drain and source zones on each side of the channel, the channel zone being strained by these drain and source zones, a step to transform the material from which the first layer is made into a porous material, a step to oxidize the porous layer to transform it into an insulating layer that may have residual porosity.

The grid insulator may be made of $HfO_2$, and the grid may be made of a stack of TiN and a layer of poly-crystalline silicon.

The spacers may be made of $Si_3N_4$, or a stack of silicon dioxide and silicon nitride $Si_3N_4$.

An etching step of the second layer may be done on each side of the channel zone, before the drain and the source zones are formed.

An etching step of at least part of the thickness of the first layer on each side of the part of the first layer located under the channel zone may be done before the formation of the drain and the source zones.

A process according to the invention may also include etching of the entire thickness of the first layer on each side of the part of the first layer located under the channel zone.

A non-etched zone of the first layer may remain between the etched zone of the second layer and doped windows or zones in the second layer.

The source and drain zones may be formed by epitaxy in etched zones of the second and/or first layer, of a material with a lattice parameter different from the lattice parameter of the material on which it is epitaxied and/or a coefficient of thermal expansion different from that of the material on which it is epitaxied.

The porous zones may be made by electro-chemical transformation, for example by electrolysis, particularly in a solution containing hydrofluoric acid.

The second layer may be epitaxied on the first layer.

It may initially be partly N doped, then an implantation may be done in this first layer to form N+doping.

A step to dope the channel zone may also be included.

Obviously, the different elements on these different figures are not shown at the same scale, and the ratio between the scales may be different on different figures.

DETAILED PRESENTATION OF PARTICULAR EMBODIMENTS

Figure 2A:
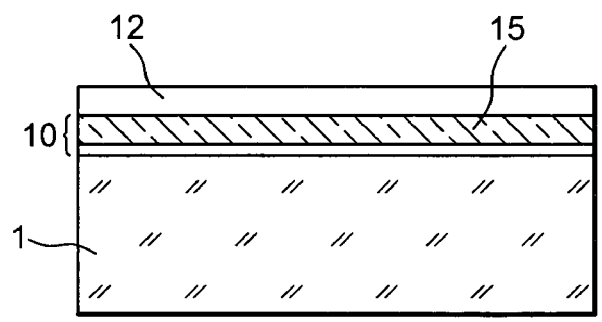
FIGS. 2a and 2b show structures for making a device according to the invention.
Figure 2B:
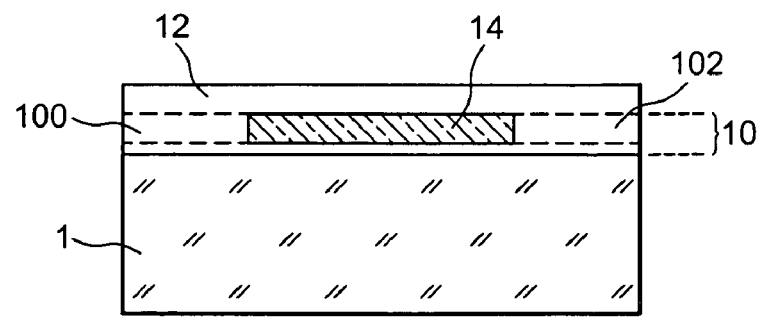

Two example devices according to the invention will now be given with reference to FIGS. 2a and 2b: FIG. 2a illustrates preparation of a substrate made of a semiconducting material 1 over its entire surface, while FIG. 2b illustrates formation of local N+ doped zones 14 on the same substrate (P doping could also be possible), which will then be made porous.

These two versions of the technological stack may be obtained by chaining of steps as follows.

The first step is to epitaxy silicon with controlled doping (slightly N doped to less than $10^{17}$ at/cm$^3$ so that it is not made porous in a later step) on substrate 1, for example made of silicon, for formation of a first layer 10.

The part 15 of the layer 10 may be obtained by implantation or epitaxy with in situ doping.

In the case shown in FIG. 2b, the part of the layer 10 formed by the indexed zones 100, 102 and 14, is obtained during the epitaxy step in which the layer 10 was formed. This part of the layer 10 comprising zones 100, 102 and 14 is initially slightly N doped.

The upper part 15 of the layer 10 (FIG. 2a) or a laterally limited portion or zone 14 of this layer 10 (FIG. 2b) is then N+ implanted. P doping would also be possible.

In the case shown in FIG. 2b, the zone 14 is initially uniformly and slightly N doped and therefore an implantation mask is used so as to only dope this zone. This mask is eliminated before formation of a second layer 12, which may itself be formed of several layers, the layer in contact with the layer or zone 14 being slightly N doped.

The next step is to form this second layer 12 in which the transistor channel will be made, for example by epitaxy.

Figure 3A:
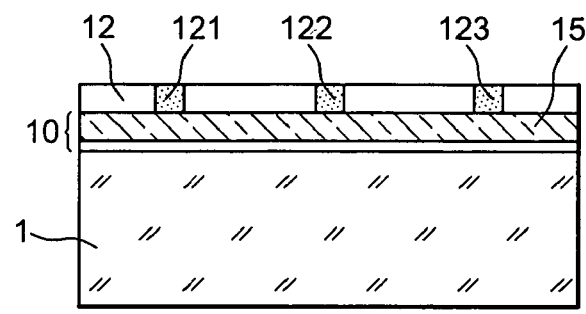
FIGS. 3a-10 show steps in the process for making a device according to the invention.
Figure 3B:
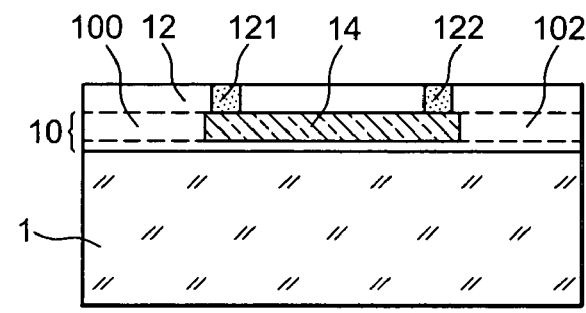

An optional step may consist of creating N+ (or P) doped zones 121, 122, 123 in this layer 12, as illustrated on FIGS. 3a and 3b derived from the structures in FIGS. 2a and 2b respectively. These doped windows 121, 122, etc., that pass through the thickness of layer 12, and that will therefore only dope indexed zones 121, 122, 123, etc., are implanted using an implantation mask.

These zones or windows 121, 122, 123 will be used for subsequent formation of lateral insulation by preferred oxidation of these same zones or windows. They will also enable porosification of this zone 15 within a continuous zone or layer 15, if this porosification is done after the second layer 12 is formed.

The plates will then eventually be subjected to an implanted doping agent recrystallization and activation annealing: if the N+ implantation (to form the layer 15 or the zone 14) causes amorphization of the implanted layer 14, the amorphized zone is annealed at high temperature. Annealing for a few seconds at 1050° C. may be sufficient for the atoms to diffuse and the amorphous zone to recrystallize. This step requires very high temperature rise and fall rates, typically of the order of 80 K/s.

The thicknesses of layers 10, 12, 100 and 102 are preferably such that these layers do not lose their role as a <<stop layer>> for this transformation, or they only loose it slightly, during high temperature technological steps to which the substrate may be subjected before the electrochemical transformation step of the zones 14, 15. Typically, the thicknesses of these layers are greater than the diffusion length of the species considered during the high temperature annealing times applied to them, this length itself depending on the temperature, the duration of annealing operations, the chemical species being diffusing and the material within which the species is diffusing. For example, the thickness of these layers may be between 10 nm and 30 nm or 50 nm or 100 nm. For example, for a SPIKE type annealing at 1050° C., this length is of the order of 8 nm for a layer 15 or a zone 14 doped to $10^{18}$ atoms/cm$^3$ and of the order of 22 nm for a layer 15 or a zone 14 doped to $10^{21}$ atoms/cm$^3$.

Other processes for making the structures illustrated on FIGS. 2a and 2b could be suggested.

Thus as a variant, an electrochemical treatment that leads to transformation of zones 14, 15 located in the first layer 10 in a porous semiconducting material may be used before formation of the second layer 12. This transformation into a porous material may for example be done by electrolysis in a solution comprising at least hydrofluoric acid. For example, formation of porous silicon is explained in the book entitled Properties of Porous Silicon (IEE, EMIS data review series No. 18, published by L. Canham, 1997). The layer of porous Si is subsequently oxidized, preferably after any epitaxy step for which the porous silicon is the substrate (an attempt is made to preserve the crystalline nature with a view towards epitaxy in order to result in a single crystal, this is the case for porous Si). Materials other than silicon may be used, for example SiGe or Ge, with a low temperature recipe for Ge.

Preferably, the porosity of the layer transformed by such a process is equal to the ratio of the molar volumes of $SiO_2$ and silicon, namely of the order of 56%, if it is required that oxidation of the silicon remaining after transformation into porous Si is equal to the volume of Si before transformation into porous Si. If the porosity is less than 56% of the initial volume of silicon, the oxide formed will be denser, and if it is more than 56%, the oxide formed will be still porous and likely to mechanically strain the materials in its environment by putting them in compression. If the porosity is more than 0.56 the oxidation will cause a reduction in the volume, and if the porosity is less than 0.56, the oxidation will cause an increase in the volume.

Since porous Si is a crystalline material (which is also the case if a semiconductor other than Si is used, for example SiGe or Ge), it may be used as a substrate for epitaxial growth of silicon or another semiconducting material (for example a silicon-germanium alloy) in order to make the layer 12. The same comment is applicable for another material such as SiGe, or Ge.

Epitaxial growth of this layer 12 takes place using equipment such as Chemical Vapor Deposition (CVD) or Molecular Beam Epitaxy (MBE) equipment. Preferably, the growth temperature is less than 700° C. so as to avoid restructuring of the porous layer; furthermore, the deposition rate is relatively high (more than 1 nm/min.) in order to prevent filling of the open pores of zone 14 or 15. For example, this epitaxy may be done at 650° C. using silane (SiH4) at a pressure of 60 Torr.

As a variant, the same electrochemical treatment (that has just been explained above) to make the zones 14, 15 porous, may be performed after formation of the second layer 12, by transforming the first layer 10 (that has become a buried layer) from the implanted windows 121, 122, 123 illustrated on FIGS. 3a and 3b. One advantage is then that prepared zones are available for formation of lateral insulation zones through zones 121, 122, 123, . . . etc., that can be preferentially oxidized in the remainder of the process. These zones 121, 122, etc. . . . are transformed into porous zones at the same time as zones 13, 15, or before these zones, so as to provide access to them. Transformation into insulating zones may take place once these zones have performed their role as an epitaxy substrate.

Figure 3C:
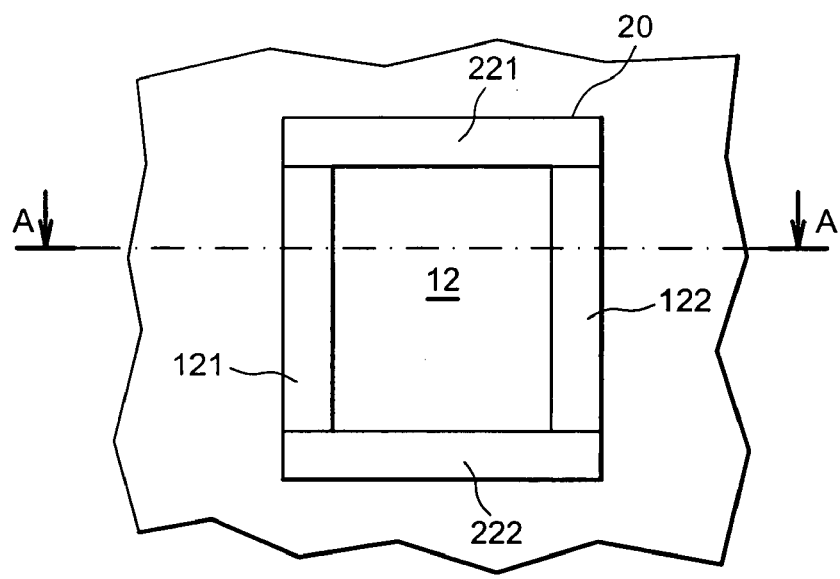

A top view of the structure illustrated on FIG. 3a may be like that shown in FIG. 3c on which the zones 121, 122 define two sides of a frame that surrounds a portion of the film 12. Two other sides 221, 222 of the same nature as zones 121, 122, could have been made in the same way as these zones. The pattern thus defined in the layer 12 is then surrounded by a box 20 delimited by the strongly N+ doped edges 121, 122, 221, 222. FIGS. 3a and 3b then represent sections along the AA axis in FIG. 3c.

For embodiments that make use of the electrochemical transformation of silicon into porous silicon immediately after preparation of the dedicated substrate and before formation of the layer 12, the temperature of the remaining technological steps preferably remains less than about 650° C., to prevent the risk of the porous silicon redensifying.

Figure 1:
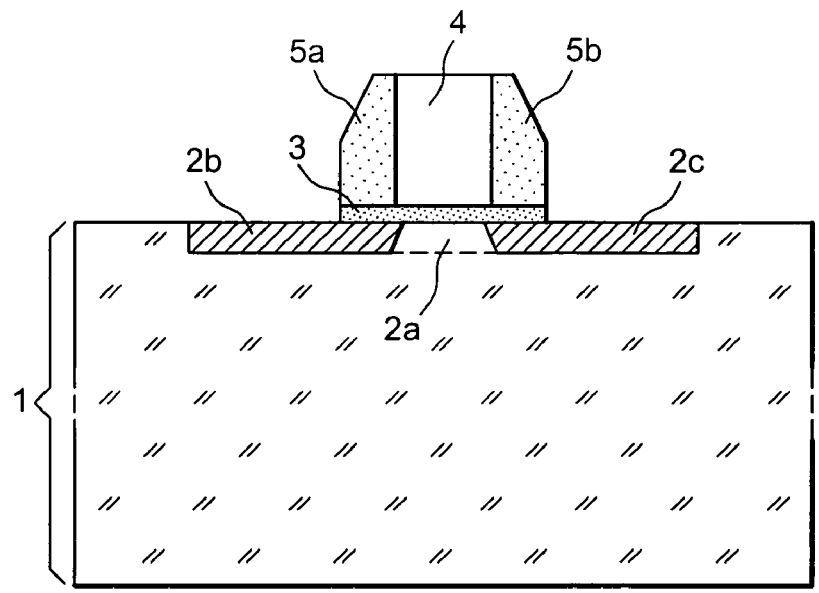
FIG. 1 shows a known transistor device.

If channel 2a (FIG. 1) is to be doped, particularly N doped to more than $10^{17}$ at/cm$^3$, the semiconductor→porous semiconductor transformation is preferably made during the specific substrate preparation step (and therefore before the second layer 12 is formed) to prevent loss of selectivity with regard to the electrochemical transformation of the buried layer 12. If the channel is N+ or P doped, it could be transformed into porous Si.

Channel 2a can then be doped during the epitaxy step of the layer 12 itself, by not altering the dense nature of the layer 12. Since epitaxy is done starting from a surface into which the pores open up, it is done at sufficiently high growth rates so that these pores are concealed without being filled in. The layer 12 is then a single crystal respecting the crystalline orientation of silicon in layer 10. The doping dose may be adjusted with respect to gas mixes introduced into the epitaxy chamber. This doping may also be done after epitaxy by a standard implantation step.

Therefore the result is a substrate comprising a first possibly but not necessarily continuous porous layer, and a second layer 12 in which the transistor channel is made, and also at least containing some cavities to form the source and the drain.

The first layer may not necessarily have been made porous at this stage. In this case, the first step is to make a first layer 10, not yet porous and insulating, and then a second layer 12.

The Si or SiGe or Ge are crystalline, regardless of whether they are porous or dense. Therefore, they may be the substrate for epitaxial growth, each with its own epitaxy conditions: the epitaxy rate on a porous surface, or a surface on which the pores open up, is chosen to be sufficiently high to close off the pores without filling them.

Figure 5:
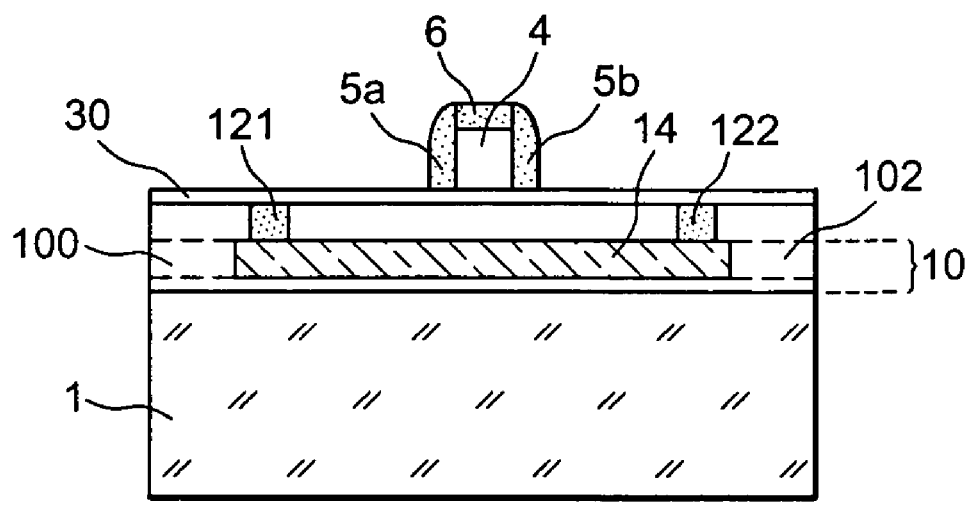

A grid stack 4 and spacers 5a, 5b can be made starting from such a substrate (FIG. 5). These elements are used differently, depending on whether or not the buried layer 14, 15 is already porous.

If this zone 14 is still dense (not yet porosified), materials that resist the electrochemical step used to subsequently transform the dense semiconducting material into a porous semiconducting material will be used in preference. This electrochemical step may use a chemical solution containing different materials including hydrofluoric acid (HF), and materials that can be attacked by this solution will preferably be avoided or protected. For example, the grid dielectric 3 (FIG. 1) may be formed of a layer 30 made of high permittivity dielectric material such as hafnium dioxide (HfO$_2$), or alumina Al$_2$O$_3$ or zirconium oxide ZrO$_2$, or a stack of these materials, rather than of SiO$_2$. The material in contact with HF will then resist this acid (for example it could be HfO$_2$).

Figure 4:
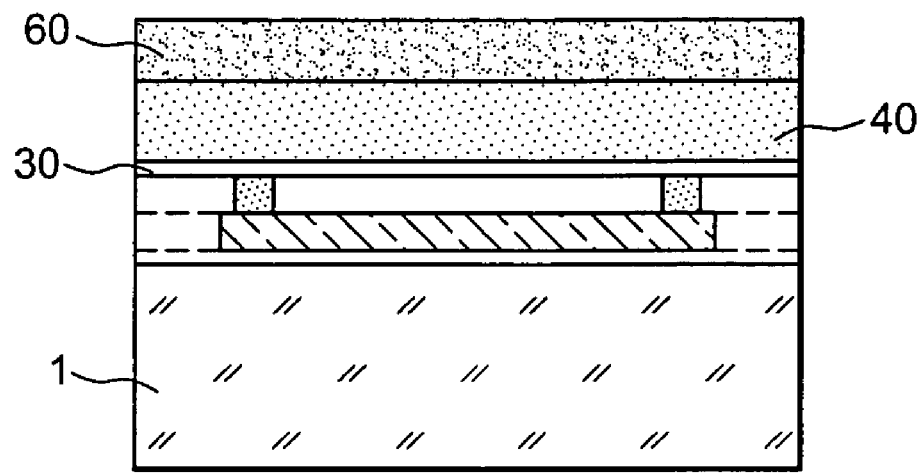

It HfO$_2$ is used for the grid dielectric 3, the grid 4 will preferably be obtained from a stack of a TiN layer and a polycrystalline silicon layer (FIG. 4). If the layer 14 is already porous, the grid oxide may be made of SiO$_2$ and the grid may be composed only of polycrystalline silicon.

The spacers 5a, 5b may be formed of nitride Si$_3$N$_4$, and in this case the top of the grid 4 is protected by a layer in which etching of the spacers will stop. This layer may itself be made of a nitride layer and is indexed 60 on FIG. 4, which illustrates the technological stack built before the grid was etched. FIG. 5 illustrates the topology of the component after etching of the grid 4 and etching of the spacers 5a, 5b. The layer or zone 40 is the grid layer (polycrystalline Si or TiN+Si-polycrystalline). The layer 60 represents the stop layer or hard mark that remains at the top of the grid on FIG. 5 after etching of the spacers: it protects the grid from a subsequent chemical etching step.

The total thermal balance applied to the architecture before the electrochemical transformation step of zones 14 and 121-123 (if they exist) is taken into account during sizing of the stop layers 10 and 12.

If the layer or zone 14 or 15 is already porous, then low temperature processes and associated materials are used in preference, preferably avoiding the formation of the SiO$_2$ thermal oxide as a grid dielectric. For example, HfO$_2$ can be deposited (at about 650° C.) over a thickness of a few nanometers to form the layer 30.

As specified above, the use of HfO$_2$ as the grid dielectric makes it possible to make a grid stack 3 of a TiN layer and a polycrystalline silicon layer.

The spacers 5a, 5b may be formed from a stack of silicon dioxide deposited at low temperature and silicon nitride SiN also deposited at low temperature. The oxide layer 30 is then used as a stop layer for etching of the spacers and there is no need for the layer 60 illustrated on FIG. 4. FIG. 4 illustrates the architecture that can be used before etching of the grid, while FIG. 5 illustrates the configuration obtained after etching operations for the grid 4 and the spacers 5a, 5b, the pedestal oxide 30 being conserved.

Since zones 121, 122, 123 are already porosified, conditions for deposition of the oxide layer 3 and the grid dielectric layer 30 are preferably selected so as to close off the pores output from these zones 121-123, without filling them. This condition allows a new access to the buried zone 14. If these conditions are not satisfied, these access zones can be exposed by local etching at these access zones 121-123 to the buried layer 14.

If the layer 14 is already porous, implantation in the layer 12 can be done through the deposited oxide, before and/or after the formation of the spacers 5a, 5b themselves (before the nitride deposit). This implantation of the layer 12 will form so-called source and drain extension zones, the channel being masked by the grid.

If the layer 14 is not yet porous, the implantation conditions will take account of the future thermal budget so that the layer 12 is not made porous, since it will be the location of electron transport when the transistor becomes functional. In other words, if there is an implantation, the implantation profiles will be chosen such that during the dense semiconductor→porous semiconductor electrochemical transformation step, there is a zone between the layer 14 and the layer 12 for which the surface layers have just been doped, with an N type doping and the concentration of the doping agent is less than $10^{17}$ atoms/cm$^3$. To achieve this, the initial layer 12 is thickened so that this condition is eventually satisfied.

The masking and dielectric removal steps are then chained to access the surface of the slightly doped silicon layer 12, preserving the dielectric 30 vertically in line with zones 121-123 (if they exist). Thus, lateral zones 70 and 72 can be defined on each side of the spacers on which the etching mask has been eliminated, as illustrated on FIG. 6.

In the case of oxide/nitride type spacers 5a, 5b, etching of the oxide in zones 70 and 72 is done so as to avoid damaging the oxide 6 at the top of the grid 4: the grid 4 is then masked, while the layer 6 illustrated on FIG. 5 acts as a natural mask.

An anisotropic etching step is then done, the grid dielectric layer 30 acting as a natural mask in the locations in which it remains.

Figure 7:
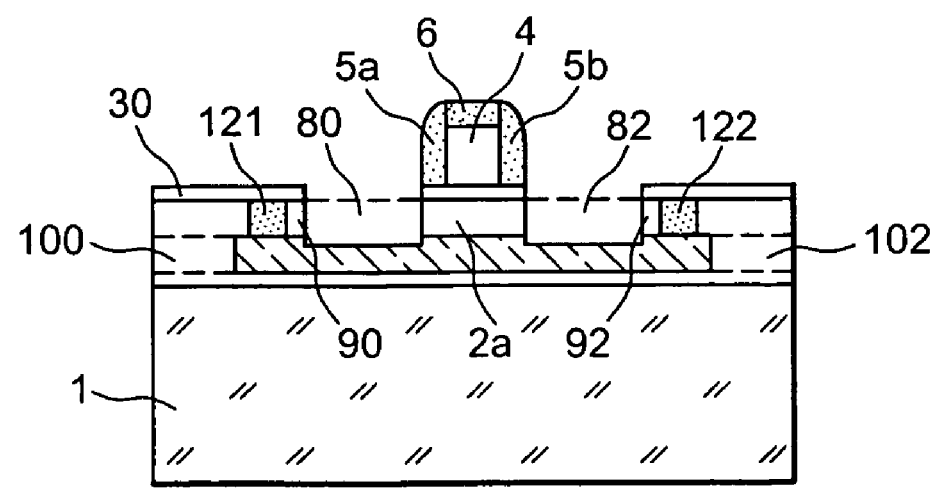

This etching is stopped in the layer 15 or 14 as illustrated on FIG. 7 that shows cavities 80 and 82 thus formed on each side of the grid, between the indexed zones 121 or 123.

Figure 6:
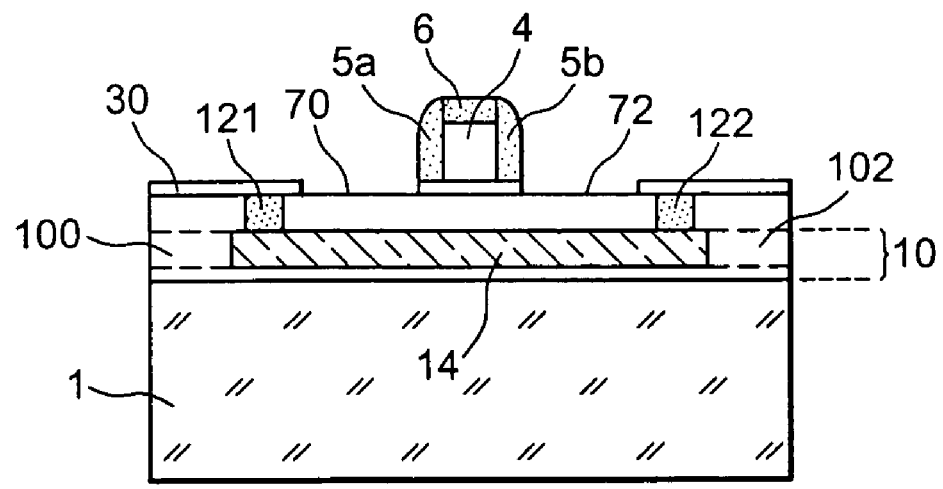

This illustration gives the topology of the device obtained from FIG. 6, and therefore FIG. 5.

A thickness 1 of the non-etched semiconducting material 90, 92 located between the cavity and the zones 121, 123 if they exist, may be sized to assure elastic rigidity at the silicon frame that will thus surround the cavities 80 and 82. The rectangular geometry of the cavities 80 and 82 that can be seen on FIG. 7 is only shown for guidance: the vertical side parts of these cavities may possibly have a given inclination and/or curvature.

Epitaxy can then be resumed in cavities 80 and 82, for example epitaxy of a silicon and germanium alloy 100, 122 can be done on silicon: this step puts this epitaxied alloy into compression, the natural lattice parameter of the epitaxied alloy being greater than the lattice parameter for the silicon or the semiconducting material 14, 15 on which it grows. This strained state of the epitaxied material in the cavities 80 and 82 will reflect the strained state of zone 2a (channel) of the layer 10 that remains under the grid 4. Thus, in the case of an SiGe epitaxy, the zone in question is put into compression when the global mechanical balance of the structure is set up.

If the channel is stressed in tension, an alloy with a lattice parameter smaller than the lattice parameter of the material used as the epitaxy substrate (14, 15) will be made to grow. Thus, if 14 and 15 are made of SiGe, silicon is used in cavities 80 and 82. Otherwise, there is always the solution of using a material with a coefficient of thermal expansion higher than that of the stiffer layer (the substrate) and that will therefore impose displacements on the other layers and will therefore stress the material in question in tension when its temperature changes from its deposition temperature $T_{dep}$ to its ambient temperature ($T_{dep} > T_{amb}$).

If zones 14 and 15 (epitaxy substrate) are made of Si, an SiGeC alloy can be used for which the carbon contents are such that the lattice parameter of SiGeC is lower than the lattice parameter of silicon.

The filling material of cavities 80 and 82 may also be a material with a different coefficient of expansion from silicon: when the temperature returns to ambient temperature from the temperature at which the material in question is deposited, this material does not shrink in the same way as the substrate and therefore it is strained. It will be put into compression (or tension) if its coefficient of expansion is smaller (or greater) than that of the silicon substrate: therefore the transistor channel 2a itself will be put into compression (or tension).

Figure 8:
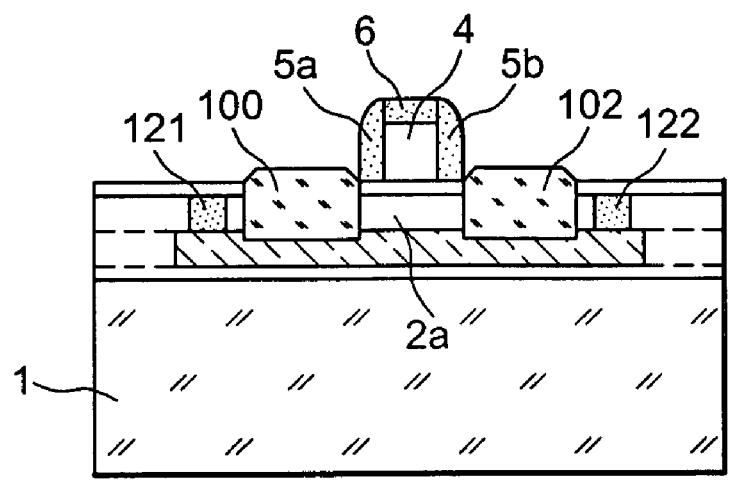

FIG. 8 illustrates the topology obtained from the state presented on FIG. 7, taking account of an epitaxy step and an shrinkage step of the grid dielectric 30 vertically in line with the access zones 121-123.

The cavities 80 and 82 may also open up in the layer 10 or even in the substrate 1. In this case, the layer 14 or 15 is broken into different unrelated zones. The final function of these zones is to isolate the device from the substrate, in which case they are made porous (if they are not already porous) and then oxidized.

This oxidation also leads to oxidation of the bottom and sides of the cavities 80, 82, from with this oxide may be removed by a chemical etching step based on hydrofluoric acid.

Epitaxy can then be resumed in these cleaned cavities.

If the N+ doped zones (121-123 and 14, 15) are already porous, the epitaxy parameters are preferably chosen to obstruct pores opening up at the bottom of the cavities, without filling these pores.

Based on the same assumption of the N+ doped zones (121-123 and 14, 15) already being porous, the dense silicon frame defined by portions 90, 92 on FIG. 7 can surround the epitaxied zones in a more rigid frame than the frame composed solely of porous silicon. The strain is then transmitted to the transistor channel more efficiently. As the width 1 if these zones 90, 92 increases, the transfer of strain to the channel 2a will also be more efficient.

Starting from the state illustrated in FIG. 8, if the layer or zones 14, 15 is not yet porous, it can be made porous using the electrochemical method described in the book entitled <<Properties of Porous Silicon>> mentioned above. If the spacers 5a, 5b are made of a SiO$_2$/Si$_3$N$_4$ dual layer, masking of the grid will prevent oxide from being consumed during this step. This is why the spacers 5a, 5b made of nitride are preferred, with the top of the grid being protected with a nitride.

Therefore, the invention can result in a strained channel device surrounded by a porous silicon box, regardless of the moment at which zones 121-123 and 14, 15 were transformed into a porous semiconducting material.

Figure 9:
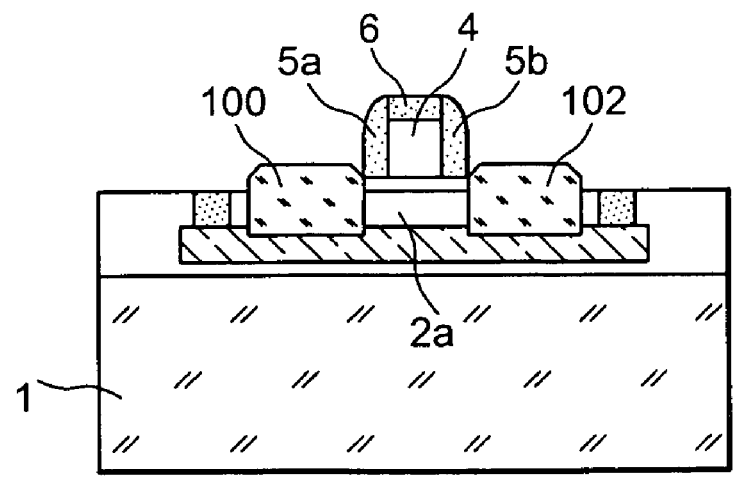

A final oxidation step is preferably used to oxidize the porous silicon. The final structure is shown on FIG. 9 in which zone 10 is formed from a porous electrical insulator (SiO$_2$) and surrounds a strained MOS transistor type device. This zone is the result of oxidation of zones 121-123 and 14, 15 previously made porous.

Figure 10:
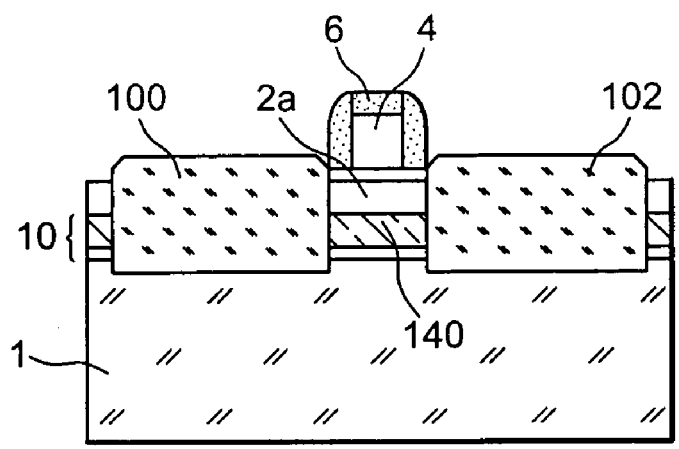

If cavities 80 and 82 opened up in layer 10, or even in substrate 1, the final cross-sectional structure is like that shown in FIG. 10.

In this case, channel 2a is strained and isolated from the substrate by the zone 140, the drain and source zones 100, 102 resting on the substrate.

If a source and a drain are both made of SiGe, the device is particularly useful for a PMOS type component because the channel is in compression and therefore the mobility of holes is better than in an unstrained case.

If a source and a drain are made from a material for which the coefficient of expansion is greater than that of the substrate (Si), this architecture is particularly attractive for an NMOS type component because the stretched channel increases the mobility of electrons.

Figure 11:
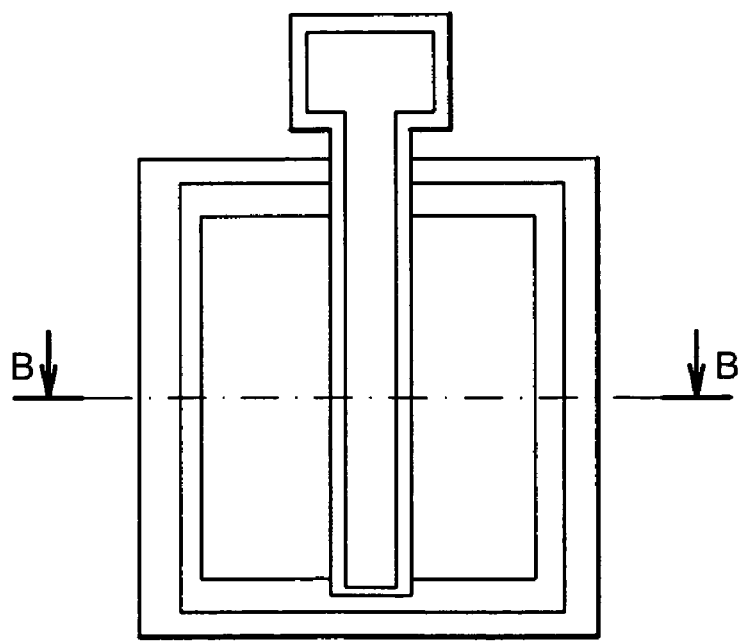
FIG. 11 shows a top view of a device according to the invention.

The device can then be completed and a diagrammatic view of the top of the device thus made is illustrated on FIG. 11, FIG. 10 possibly representing a section of this top view taken in the plane of section BB defined on FIG. 11.

If accesses 121-123 have not been formed as illustrated on FIGS. 2a and 2b, an access may be obtained to the buried layer 14, 15 by opening a so-called STI <<Shallow Trench Isolation>> type trench in the layer 12. This trench may open up in the buried layer 14, 15 to enable its transformation into a porous semiconducting material and/or oxidation. The trench may then be filled in by an electrical insulator ($SiO_2$). Considering the above, the final topology will then be like that shown in FIG. 11.

The material made porous during the process has a lower mechanical stiffness than the dense material. The frame (FIG. 11) formed by zones 90 and 92 gives a better transfer of strains from the source and drain to the channel (the channel is dense). Consequently, the insulating material is no longer porous.

For any of the embodiments disclosed in the present document or in the scope of the present patent a device and a method according to the invention offer the advantage of obtaining a strain over or on the whole thickness of channel 2a, which renders the strain homogeneous over or on the channel.

The invention claimed is:

1. Process for the formation on a substrate of a strained channel transistor isolated from said substrate, comprising:
    formation of an insulating layer, called first layer, on said substrate,
    formation of a channel zone on said insulating layer, called second layer, in a layer made of a semiconducting material,
    said first layer being made porous, then insulating, after formation of said second layer, into which a channel is then formed,
    formation of a grid insulator, of a grid and of spacers on each side of said grid,
    formation of drain and source zones, on each side of said channel, said channel zone being strained by said drain and source zones.

2. Process according to claim 1, said formation of an insulating layer including a step to oxidize a porous layer.

3. Process according to claim 1 including a prior step for the formation of doped windows or zones or trenches in said second layer.

4. Process according to claim 1, said grid insulator being made of $HfO_2$, and said grid consisting of a stack of TiN and a layer of poly-crystalline silicon.

5. Process according to claim 1, said spacers being made of $Si_3N_4$.

6. Process according to claim 1, said spacers consisting of a stack of silicon dioxide and silicon nitride SiN.

7. Process according to claim 1, including, before said drain and source zones are formed, an etching step of said second layer, on each side of said channel zone.

8. Process according to claim 7, also including, before said drain and said source zones are formed, etching of part of a thickness of said first layer on each side of said part of said first layer located under said channel zone.

9. Process according to claim 8, also including etching of the entire thickness of said first layer on each side of the part of said first layer located under said channel zone.

10. Process according to claim 7, a non-etched zone of said first layer remaining between said etched zone of said second layer and doped windows or zones in said second layer.

11. Process according to claim 7, said source and drain zones being formed by epitaxy in etched zones of said second and/or first layer, of a material with a lattice parameter different from a lattice parameter of the material on which it is epitaxied and/or a coefficient of thermal expansion different from that of the material on which it is epitaxied.

12. Process according to claim 1, said porous zones being made by electro-chemical transformation, for example by electrolysis.

13. Process according to claim 12, said porous zones being formed by electrolysis in a solution containing hydrofluoric acid.

14. Process according to claim 1, said second layer being epitaxied on said first layer.

15. Process according to claim 1, said first layer initially being partly N doped, then an implantation being done in said first layer to form N+ doping.

16. Process according to claim 1, also including a step to dope said channel zone.

17. Process for formation on a substrate of a strained channel transistor isolated from said substrate, comprising:
    a step to form a first layer on said substrate,
    a step to form a channel zone on said first layer, in a layer made of a semiconducting material, called second layer,
    a step to form a grid insulator, a grid and spacers on each side of said grid, then this order or in the reverse order:
    a step to form drain and source zones, on each side of said channel, said channel zone being strained by said drain and source zones,
    a step to transform said material from which said first layer is made into a porous insulating material.

18. Process according to claim 17, said grid insulator being made of $HfO_2$, and said grid consisting of a stack of TiN and a layer of poly-crystalline silicon.

19. Process according to claim 17, said spacers being made of $Si_3N_4$ or comprising a stack of silicon dioxide and silicon nitride SiN.

20. Process according to claim 17, including, before said drain and source zones are formed, an etching step of said second layer, on each side of said channel zone.

21. Process according to claim 20, also including, before said drain and said source zones are formed, etching of part of a thickness of said first layer on each side of said part of said first layer located under said channel zone.

22. Process according to claim 21, also including etching of the entire thickness of said first layer on each side of said part of said first layer located under said channel zone.

23. Process according to claim 21, a non-etched zone of said first layer remaining between said etched zone of said second layer and doped windows or zones in said second layer.

24. Process according to claim 20, said source and drain zones being formed by epitaxy in etched zones of said second and/or first layer, of a material with a lattice parameter different from a lattice parameter of the material on which it is epitaxied and/or a coefficient of thermal expansion different from that of the material on which it is epitaxied.

25. Process according to claim 17, said porous zones being made by electro-chemical transformation, for example by electrolysis.

26. Process according to claim 25, said porous zones being formed by electrolysis in a solution containing hydrofluoric acid.

27. Process according to claim 17, said second layer being epitaxied on said first layer.

28. Process according to claim 17, said first layer initially being partly N doped, then an implantation being done in said first layer to form N+ doping.

29. Process according to claim 17, also including a step to dope said channel zone.

* * * * *

UNITED STATES PATENT AND TRADEMARK OFFICE
CERTIFICATE OF CORRECTION

PATENT NO. : 7,635,615 B2 Page 1 of 1
APPLICATION NO. : 11/454398
DATED : December 22, 2009
INVENTOR(S) : Barbe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 840 days.

Signed and Sealed this

Ninth Day of November, 2010

David J. Kappos
*Director of the United States Patent and Trademark Office*